United States Patent [19]

Kowshik

[11] Patent Number: 5,625,211
[45] Date of Patent: Apr. 29, 1997

[54] TWO-TRANSISTOR ELECTRICALLY-ALTERABLE SWITCH EMPLOYING HOT ELECTRON INJECTION AND FOWLER NORDHEIM TUNNELING

[75] Inventor: Vikram Kowshik, Fremont, Calif.

[73] Assignee: Actel Corporation, Sunnyvale, Calif.

[21] Appl. No.: 371,685

[22] Filed: Jan. 12, 1995

[51] Int. Cl.$^6$ .................... H01L 29/788; H01L 27/108
[52] U.S. Cl. .................... 257/317; 257/298; 257/320; 257/321; 365/185.07; 365/185.08; 365/185.1; 365/185.26
[58] Field of Search .................... 365/185.07, 185.08, 365/185.1, 185.11, 185.13, 185.26, 185.28; 257/298, 317, 320, 321

[56] References Cited

U.S. PATENT DOCUMENTS

| | | | |
|---|---|---|---|
| 4,132,904 | 1/1979 | Harari | 307/238 |
| 4,300,212 | 11/1981 | Simko | 365/185 |
| 4,375,086 | 2/1983 | van Velthoven | 365/149 |
| 4,495,427 | 1/1985 | Cartwright | 307/469 |
| 4,617,479 | 10/1986 | Hartmann et al. | 307/465 |
| 4,622,656 | 11/1986 | Kamiya et al. | 365/185 |
| 4,672,580 | 6/1987 | Yau et al. | 365/185.08 |
| 4,742,492 | 5/1988 | Smayling et al. | 365/218 |
| 4,822,753 | 4/1989 | Pintchovski et al. | 437/192 |
| 4,851,361 | 7/1989 | Schumann et al. | 437/30 |
| 4,858,185 | 8/1989 | Kowshik et al. | 365/181 |
| 4,878,199 | 10/1989 | Toshiba | 365/185 |
| 5,015,885 | 5/1991 | El Gamal et al. | 307/465 |
| 5,136,540 | 8/1992 | Hayashi et al. | 365/185.08 |
| 5,247,478 | 9/1993 | Guota et al. | 365/185 |

*Primary Examiner*—Ngân V. Ngô
*Attorney, Agent, or Firm*—D'Alessandro & Ritchie

[57] ABSTRACT

An electrically-alterable switch includes a floating gate EEPROM transistor having a source, a drain, a control gate, and a floating gate. A select transistor includes a source capacitively coupled to the floating gate of the EEPROM transistor via a tunneling oxide, a drain, and a gate. A pass transistor, having a source, a drain, and a gate comprising a portion of the floating gate may be included in the structure.

3 Claims, 3 Drawing Sheets

TWO-TRANSISTOR ELECTRICALLY-ALTERABLE SWITCH EMPLOYING HOT ELECTRON INJECTION AND FOWLER NORDHEIM TUNNELING

BACKGROUND OF THE INVENTION

1. Field of The Invention

The present invention relates to solid state switching devices. More particularly, the present invention relates to a two-transistor electrically-alterable switch employing hot electron injection for erasing and Fowler Nordheim tunneling for programming. Typical environments for the present invention include using the switch to control a pass transistor for user-programmable circuit applications.

2. The Prior Art

The problem of providing non-volatile switching elements has been addressed in the prior art. Several solutions have been proposed. With the exception of using a non-volatile (e.g., EPROM or EEPROM) transistor itself as a switching element, see U.S. Pat. No. 5,015,885 to El Gamal et al, all of the prior art solutions to the problem of providing a non-volatile switch element require the use of a relatively large number of devices.

U.S. Pat. No. 4,132,904 to Harrari, discloses a static-RAM-like structure employing a cross-coupled CMOS latch in which the N-Channel transistors are provided with floating gates which may be programmed to impart a desired state to the latch. While the Harrari circuit does provide a non-volatile latch which provides complementary data which can be reprogrammed, it requires high-voltage n-well structures and provides indeterminate data on first powerup. In addition, the floating gate structures are prone to the well known read-disturb phenomenon by which repeated read operations can degrade the stored data.

U.S. Pat. No. 4,300,212 to Simko discloses a non-volatile static RAM circuit. It employs a very large cell size including at least eight transistor devices, some of which are complicated semiconductor structures.

U.S. Pat. No. 4,858, 185 to Kowshik et al. discloses a structure employing a CMOS non-volatile latch. While the Kowshik et al. latch does provide a non-volatile latch which provides complementary data which can be reprogrammed, can assume a known state on powerup and does not require high-voltage n-well technology, it requires a very large cell size employing ten transistors as well as other structures.

It is therefore an object of the present invention to provide a non-volatile switching element which overcomes some of the shortcomings of the prior art.

Another object of the present invention is to provide a non-volatile switching element which employs a small cell size.

Another object of the present invention is to provide a non-volatile switching element which employs a minimum number of transistor devices.

A further object of the present invention is to provide a non-volatile switching element which does not require high-voltage n-well technology.

Yet another object of the present invention is to provide a non-volatile switching element which has improved read-disturb immunity.

It is a further object of the present invention to provide a non-volatile switching element which assumes a known state on powerup after initial programming.

BRIEF DESCRIPTION OF THE INVENTION

According to one aspect of the present invention, an electrically-alterable switch includes a floating gate EEPROM transistor having a source, a drain, a control gate, and a floating gate. A select transistor includes a source capacitively coupled to the floating gate of the EEPROM transistor via a tunneling oxide, a drain, and a gate. A pass transistor, having a source, a drain, and a gate comprising a portion of the floating gate may be included in the structure.

According to another aspect of the present invention, a plurality of electrically-alterable switches may be disposed in an array of rows and columns. Each electrically-alterable switch in a particular row includes a floating gate EPROM transistor having a source, a drain, a control gate, and a floating gate. A select transistor includes a source capacitively coupled to the floating gate of the EPROM transistor via a tunneling oxide, a drain, and a control gate. A pass transistor, having a source, a drain, and a gate comprising a portion of the floating gate may be included in the structure.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
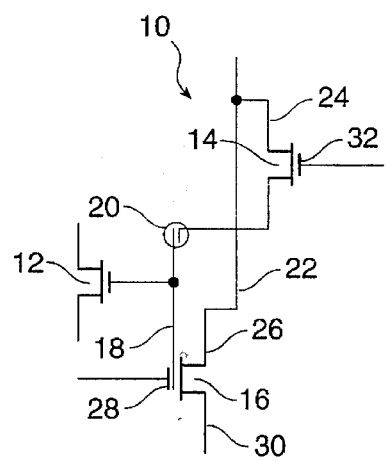
FIG. 1 is a schematic diagram of a two-transistor electrically-alterable switch according to the present invention in combination with a single pass transistor.

Referring first to FIG. 1, a schematic diagram of a two-transistor electrically-alterable switch 10 according to the present invention is shown driving a single pass transistor 12, which may be an N-Channel enhancement transistor. The two-transistor electrically-alterable switch 10 is meant to be addressable and thus includes an N-Channel MOS select transistor 14 and a floating gate MOS transistor 16. The floating gate 18 of MOS floating gate transistor 16 also comprises the gate of pass transistor 12. In addition, the floating gate 18 is coupled to the source of select transistor 14 by a tunneling capacitor shown at reference numeral 20. Those of ordinary skill in the art will understand that tunneling capacitor 20 comprises a region of the floating gate 18 separated from the diffused region in the substrate comprising the source of select transistor 14 by a thin tunnel dielectric.

The two-transistor electrically-alterable switch 10 of the present invention may be erased by taking bit line 22, to which drain 24 of the select transistor 14 and the drain 26 of floating gate transistor 16 are connected, to a first programming voltage Vpp1, and taking the control gate 28 of the floating gate transistor 16 to a second programming voltage Vpp2. As presently preferred, Vpp1 is a voltage in the range of from about 8 to about 12 volts, and Vpp2 is a voltage in the range of from about 10 to about 15 volts. The source 30 of the floating gate transistor 16 is held at ground potential. Under these conditions, hot electrons are generated at the drain 26 of floating gate transistor 16 with enough energy to become trapped onto the floating gate 18. As will be appreciated by those of ordinary skill in the art, once enough electrons have become trapped on floating gate 18, the negative charge will turn off the enhancement pass transistor 12 since its gate comprises a portion of floating gate 18.

The two-transistor electrically-alterable switch 10 of the present invention may be programmed by taking bit line 22 and the gate 32 of select transistor 14 to the first programming voltage Vpp1, while holding the control gate 28 of floating gate transistor 16 at ground potential and letting the source 30 of floating gate transistor 16 float. This operation causes a high electric field to exist across the tunneling capacitor 20. This electric field has a magnitude high enough to cause Fowler-Nordheim tunneling of electrons off of the floating gate 18, and will turn on the pass transistor 12 once the charge on the floating gate 18 becomes positive enough.

Figure 3:
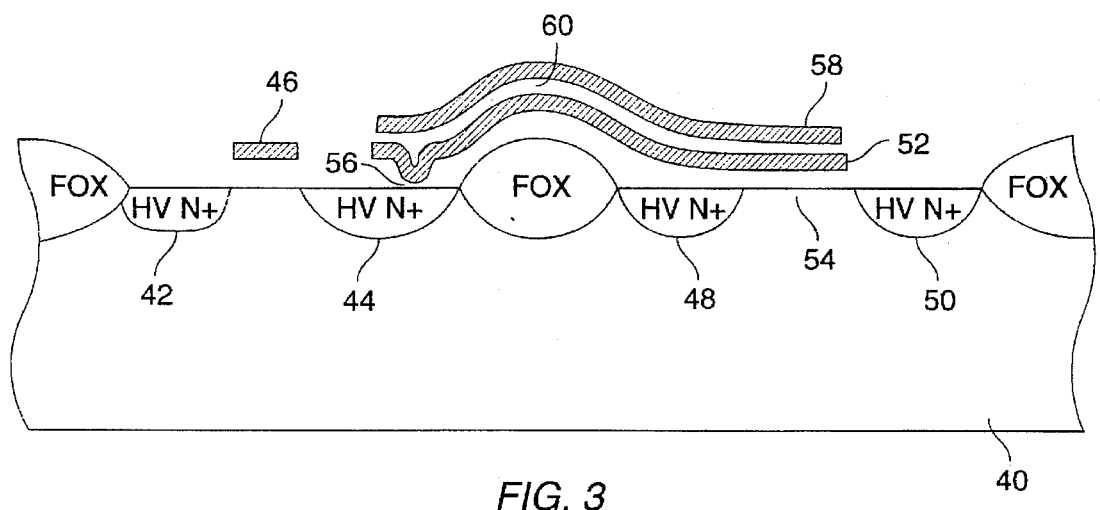
FIG. 3 is a cross-sectional view of the illustrative semiconductor layout of the two-transistor electrically-alterable switch of FIG. 2, taken through lines 3—3.
Figure 2:
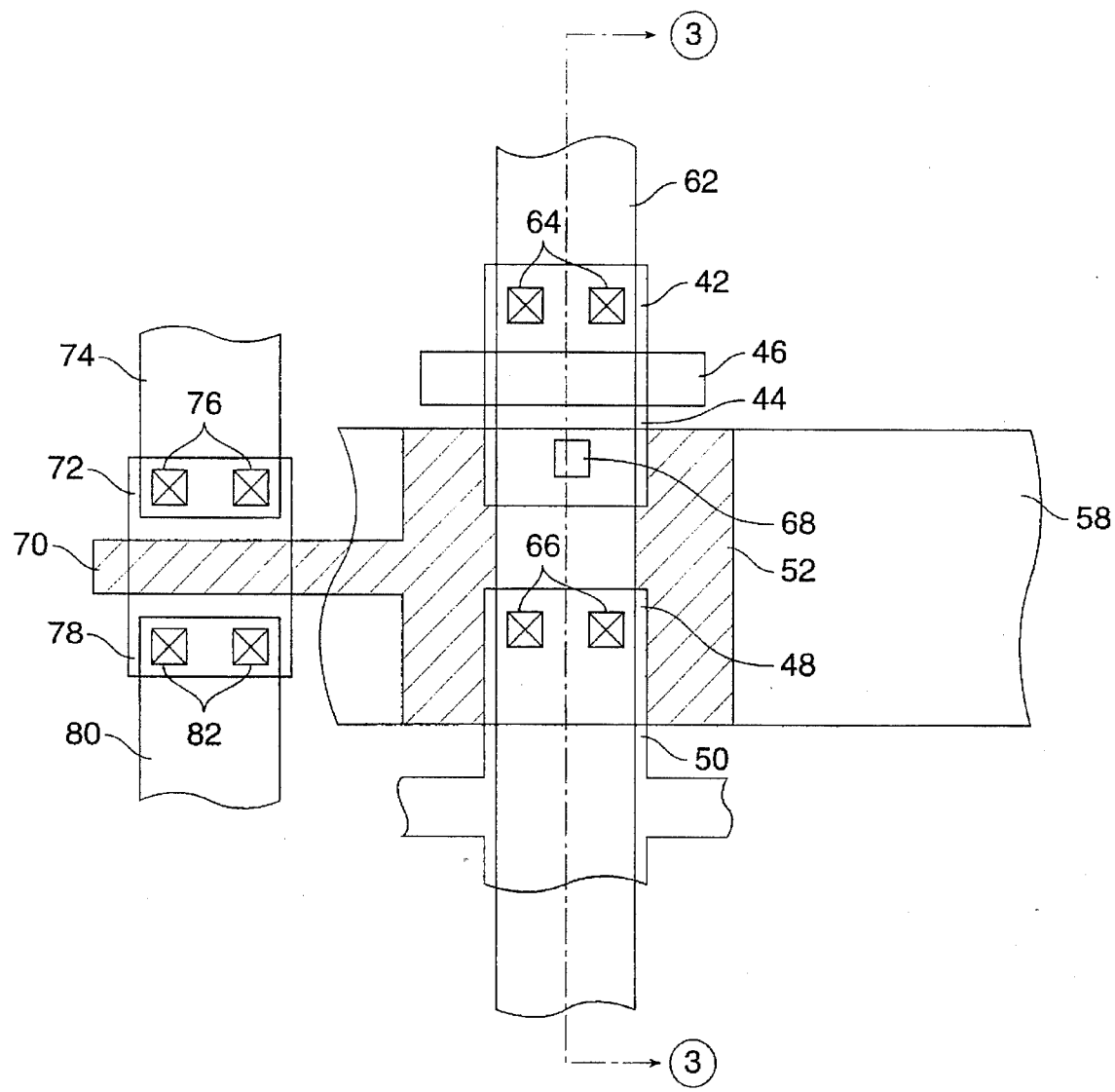
FIG. 2 is a top view of an illustrative semiconductor layout of the two-transistor electrically-alterable switch of FIG. 1.

Referring now to FIGS. 2 and 3, top and cross-sectional views of an illustrative semiconductor layout of the two-transistor electrically-alterable switch 10 of FIG. 1 are presented. FIG. 3 is a cross-sectional view of the illustrative semiconductor layout of the two-transistor electrically-alterable switch 10 of FIG. 2, taken through lines 3—3. Where applicable, and for aiding in an understanding of the present invention, the reference numerals from FIG. 1 will be used in the text to identify physical elements present in FIG. 1 in FIGS. 2 and 3 but will not be shown in FIGS. 2 and 3.

The two-transistor electrically-alterable switch 10 of the present invention is formed in a semiconductor substrate 40. Diffused regions 42 and 44 formed in semiconductor substrate 40 comprise the drain and source, respectively, of a high-voltage select transistor 14. Polysilicon line 46 forms the gate 32 of select transistor 14. Polysilicon line 46 is preferably formed from a second polysilicon layer, as will be understood by those of ordinary skill in the art. Diffused regions 48 and 50 formed in semiconductor substrate 40 comprise the drain and source, respectively, of floating gate transistor 16. As will be appreciated by those of ordinary skill in the art, diffused regions 42, 44, 48, and 50 preferably comprise high-voltage implants capable of withstanding the programming voltages which will be employed.

Polysilicon layer 52, formed from a first polysilicon layer, comprises the floating gate 18. Polysilicon layer 52 extends over the channel region 54 between diffused regions 48 and 50 and also extends over diffused region 44, the source of select transistor 14. The region of polysilicon layer 52 which extends over diffused region 44 is separated from diffused region 44 by a thin tunnel dielectric layer 56 as is known in the art. The control gate 28 of floating gate transistor 16 is formed from a second polysilicon layer 58 which is disposed over first polysilicon layer 52 and separated therefrom by an inter-poly oxide layer 60. Second polysilicon layer 58 is shown running in a direction orthogonal to that of first polysilicon layer 52 to facilitate integrating a plurality of two-transistor electrically alterable switches 10 into an array according to another aspect of the present invention.

The drains 24 and 26 of select transistor 14 and floating gate transistor 16 diffused (regions 42 and 48 of FIGS. 3 and 4) are connected to a metal bit line 62 via double contacts 64 and 66, respectively, although persons of ordinary skill in the art will recognize that single contacts could also be employed. As shown most clearly in FIG. 3, the source diffused region 50 of the floating gate transistor 16 may be shaped so as to permit formation of mirror cells in an array of two-transistor electrically alterable switches 10, as is known in the semiconductor layout art. The portions of floating gate polysilicon layer 52 and drain diffuse region 44 of the select transistor 14 separated by the tunnel dielectric layer 56 form a tunneling capacitor 68, shown in FIG. 2.

An extending finger 70 of the floating gate polysilicon layer 52 forms the gate of pass transistor 12 of FIG. 1. N-type doped region 72 forms the drain of pass transistor 12 and is connected to metal line 74 via double contacts 76. Similarly, N-type doped region 78 forms the source of pass transistor 12 and is connected to metal line 80 via double contacts 82. Those of ordinary skill in the art will recognize that the location of pass transistor 12 in the layout of FIG. 2 is arbitrary, and the embodiment shown in FIG. 2 is merely illustrative. In an embodiment of the present invention used in a user-programmable integrated circuit device such as an FPGA integrated circuit, metal lines 74 and 80 could be, for example, individual programmable interconnect conductors, and the location of pass transistor 12 will be determined by the location of these conductors. In such a case, the extending finger 70 of floating gate polysilicon layer 52 may be non-contiguous with the main portion of polysilicon layer 52 and may be connected thereto by a metal line as is well known in the art.

As may be seen from an examination of FIGS. 2 and 3, the two-transistor electrically alterable switch element of the present invention may be fabricated as a part of a conventional two-level polysilicon gate CMOS integrated circuit fabrication process. Such a process begins with the conventional steps for forming the n-wells (for peripheral devices in the CMOS process), the field implant and field oxidation steps.

A high-voltage n-type region comprising the region 44 under the tunneling capacitor is then formed in the substrate using buried n+ mask and implant. Alternatively, this region 44 can also be formed in the n-type source/drain diffusion using known high-voltage techniques.

Next, a tunnel window is etched to expose the high-voltage n diffusion comprising the global erase line and the tunnel dielectric layer 56 is formed, preferably from high quality oxide, and is then defined in the tunnel window. The first polysilicon layer 52 which will comprise the floating gate 18 is then formed, doped and defined, using conventional semiconductor processing technology.

This step is followed by the deposition of an interpoly dielectric oxide layer 60. This interpoly oxide layer 60 is then removed from the area in which the gate oxides will be formed as well as the source/drain areas, using a interpoly dielectric mask and etch.

The gate oxide step for the formation of other P-Channel and N-Channel transistor devices on the integrated circuit is then performed, followed by deposition of a second ploysilicon layer 58, and the doping, and definition of the polysilicon gates for those other transistor devices. An implant oxide is formed, followed by the masking and implant steps necessary to form both the P-Channel and N-Channel self-aligned source and drain regions.

Next, BPSG deposition, contact window formation, and first level metal steps are performed using conventional semiconductor processing techniques. Subsequent metal layers and other back-end processing may then be performed as is well known in the art.

The details of the individual process steps used in the fabrication of the two-transistor, electrically-alterable switch 10, such as times, temperatures, doses, thicknesses, etc., are well known in the art for formation of CMOS devices and have therefore not been recited herein. As will be recognized by persons of ordinary skill in the art, the process described herein for the fabrication of the switch of the present invention may be practiced using standard CMOS processing steps, and employing conventional layer thicknesses, implant dosages, etc. The additional processing steps used to form the floating gate 18, tunnel dielectric layer 56 tunneling, and capacitor 68 are well known in the EEPROM and EPROM art and are not repeated here in order to avoid overcomplicating the disclosure.

Figure 4:
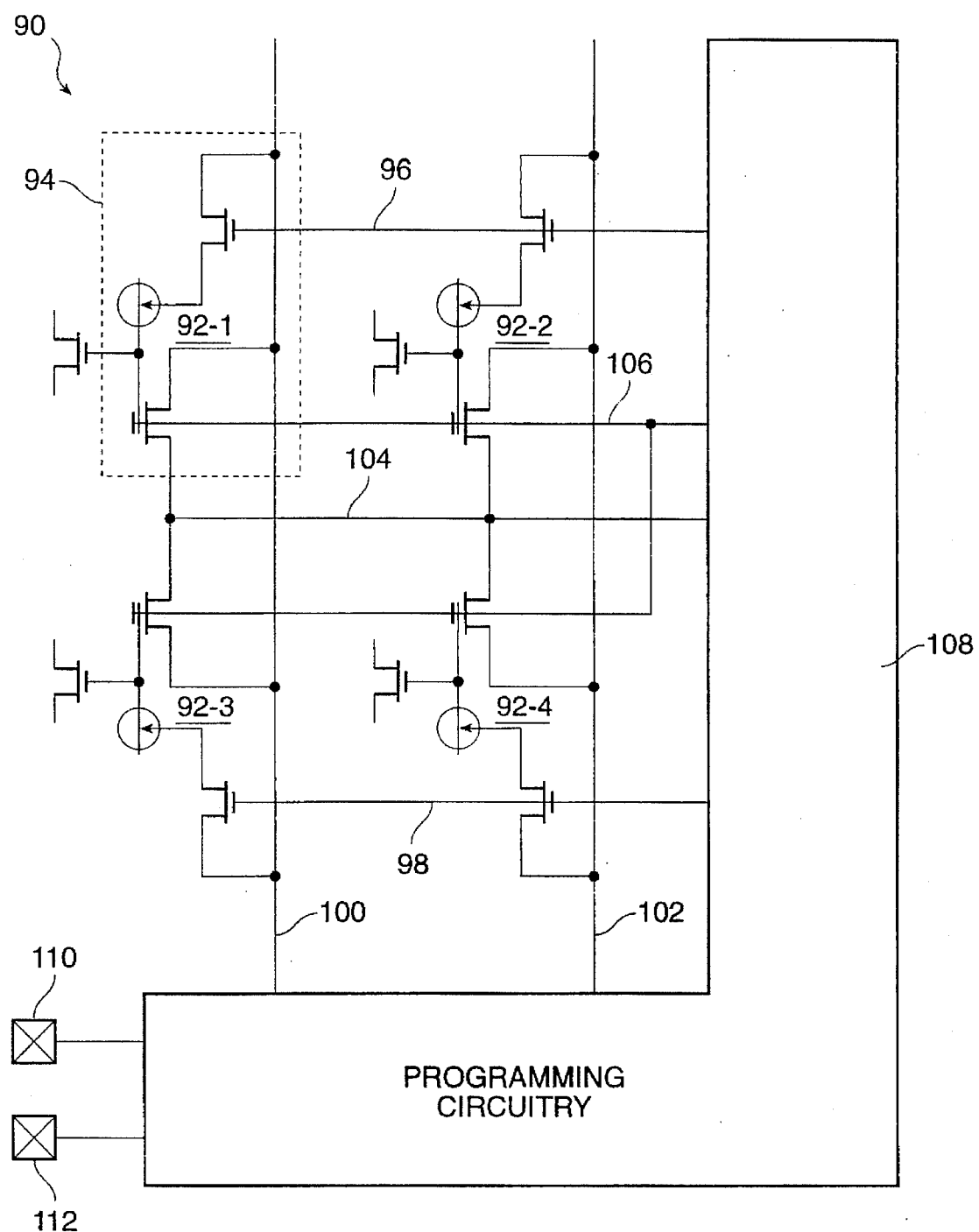
FIG. 4 is a schematic diagram of an illustrative two-by-two array of two-transistor electrically-alterable switches such as that of FIG. 1.

The two-transistor electrically-alterable switch 10 of the present invention is particularly suitable for use in an array containing a plurality of such two-transistor electrically alterable switches 10. One such application is a user-programmable integrated circuit such as an FPGA integrated circuit, where the pass transistors are used to make connections between interconnect conductors and for defining circuit functions. FIG. 4 is a schematic diagram of an illustrative two-by-two array 90 of two-transistor electrically-alterable switches such as those of FIGS. 1–3.

An illustrative one of the two-transistor electrically-alterable switches 92-1 is show inside dashed lines 94. The first row of the array 90 includes two-transistor electrically-alterable switches 92-1 and 92-2 and the second row of the array 90 includes two-transistor electrically-alterable switches 92-3 and 92-4. The first column of the array 90 includes two-transistor electrically-alterable switches 92-1 and 92-3 and the second row of the array 90 includes two-transistor electrically-alterable switches 92-2 and 92-4. A first row line 96 comprises the gates of all of the select transistors 14 in the first row of the array 90 and a second row line 98 comprises the gates of all of the select transistors 14 in the second row of the array 90. A first column line 100 is connected to the drains of all select transistors 14 and floating gate transistors 16 in the two-transistor electrically-alterable switches 92-1 and 92-3 in the first column of the array 90 and a second column line 102 is connected to the drains of all select transistors 14 and floating gate transistors 16 in the two-transistor electrically-alterable switches 92-2 and 92-4 in the second column of the array 90. The sources of all of the floating gate transistors 16 in the array 90 are connected to a common virtual ground line 104. The control gates 28 of all of the floating gate transistors 16 in the array are connected to a common control gate line 106. First and second row lines 96 and 98, first and second column lines 100 and 102, common virtual ground line 104 and control gate line 106 are connected to programming circuitry 108, which is used to provide the Vpp1 and Vpp2 programming voltages necessary to program and erase the two-transistor electrically-alterable switches 92-1 through 92-4 in the array 90.

Programming circuitry 108 is configured to selectively provide either Vpp1 or zero volts to each of the first and second row lines 96 and 98 and first and second column lines 100 and 102, Vpp2 or zero volts to the common control gate line 106, and zero volts or a floating high-impedance state to the virtual ground line 104. Such programming circuitry for selectively providing such voltages is conventional and well understood by those of ordinary skill in the art, and may be controlled from off of the integrated circuit via selected I/O pins as is known in the art. The configuration of programming circuitry 108 and the number of I/O pins needed to transfer programming information to programming circuit 108 will be a matter of simple design choice. Two illustrative I/O pins 110 and 112 are shown in FIG. 4.

During normal circuit operation, common virtual ground line 104 is at zero volts. To bulk erase all of the two-transistor electrically-alterable switches 92-1 through 92-4 in the array 90, programming circuitry 108 keeps common virtual ground line 104 at zero volts, places zero volts on first and second row lines 96 and 98, and places Vpp1 on first and second column lines 100 and 102, and places Vpp2 on common control gate line 106. This causes generation of hot electrons at the drains 26 of all of the floating gate transistors 16. These hot electrons pass through the gate oxide and become trapped on the floating gate 18, imparting to it a negative charge. As a result of the erase operation, all enhancement mode NMOS pass transistors 12 are turned off.

Any of the two-transistor electrically-alterable switches 92-1 through 92-4 in the array 90 may be programmed under the control of programming circuitry 108. During the programming operation, common virtual ground line 104 is allowed to float, common control gate line 106 is brought to zero volts, and the row line for the row containing the two-transistor electrically-alterable switch to be programmed is brought to Vpp1. The column line of the column containing the two-transistor electrically-alterable switch to be programmed is raised to Vpp1. This action causes electrons to tunnel from the floating gate in the two-transistor electrically-alterable switch being programmed, rendering the floating gate more positive and turning on the pass transistor in the programmed two-transistor electrically-alterable switch.

As an example, if two-transistor electrically-alterable switch 92-1 is to be programmed, first row line 96 and first column line 100 are brought to Vpp1, common virtual ground line 104 is allowed to float, and common control gate line 106 is brought to zero volts.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An electrically-alterable switch including:

a floating gate MOS transistor having a source, a drain, a control gate, and a floating gate;

a select transistor including a source capacitively coupled to said floating gate via a tunneling oxide, a drain connected to the drain of said floating gate MOS transistor, and a gate; and a pass transistor, having a source, a drain, and a pass gate, said pass gate comprising a portion of said floating gate.

2. An electrically-alterable switch fabricated on a semiconductor substrate, including:

a first pair of spaced-apart source and drain regions disposed in the semiconductor substrate and forming a first channel region therein;

a second pair of spaced-apart source and drain regions disposed in the semiconductor substrate and forming a second channel region therein, said second pair comprising a second source region and a second drain region;

a third pair of spaced-apart source and drain regions disposed in the semiconductor substrate and forming a third channel region therein;

a floating gate comprising a first layer of polysilicon separated from an upper surface of said semiconductor substrate by a gate oxide, said floating gate overlying said first channel region and partially overlying said second source region, a portion of said floating gate overlying said second source region separated from said second source region by a tunneling dielectric;

a first control gate comprising a first portion of a second layer of polysilicon, said first control gate overlying said floating gate and capacitively coupled thereto by an interpoly oxide layer;

a second control gate comprising a second portion of said second layer of polysilicon, said second control gate overlying said second channel region and separated from said second channel region by a gate oxide, said second portion of said second layer separated from said first portion of said layer; and a pass transistor gate formed from one of said first and second polysilicon layers, said pass transistor gate overlying said third channel region and separated from said third channel region by a gate oxide, said pass transistor gate electrically connected to said floating gate.

3. An array of electrically-alterable switches, including:

a plurality of electrically-alterable switches, each including a floating gate MOS transistor having a source, a drain, a control gate, and a floating gate, a select transistor including a source capacitively coupled to said floating gate via a tunneling oxide, a drain, and a gate, and a pass transistor, having a source, a drain, and a pass gate, said pass gate comprising a portion of said floating gate, said plurality of electrically-alterable switches arranged in an array of rows and columns;

a row line associated with each row of said array, each said row line connected to the gates of the select transistors of the ones of said electrically-alterable switches in its associated row;

a column line associated with each column of said array, each said column line connected to the drains of the select transistors and the floating gate transistors of the ones of said electrically-alterable switches in its associated row;

a common gate line connected to the control gates of all of said floating gate transistors in said array;

a common virtual ground line connected to the sources of all of said floating gate transistors in said array;

a programming circuitry, said programming circuitry connected to each said row line, each said column line, said common gate line and said common virtual ground line for selectively driving each said row line to ground or to a first programming voltage, for selectively driving each said column line to ground or to said first programming voltage, for selectively driving said common gate line to ground or to a second first programming voltage, and for selectively driving common virtual ground line to ground or to a high-impedance state to program and erase said electrically-alterable switches in said array.

* * * * *

UNITED STATES PATENT AND TRADEMARK OFFICE
CERTIFICATE OF CORRECTION

| | | |
|---|---|---|
| PATENT NO. | : | 5,625,211 |
| DATED | : | April 29, 1997 |
| INVENTOR(S) | : | Vikram Kowshik |

It is certified that error appears in the above-indentified patent and that said Letters Patent is hereby corrected as shown below:

Column 3, line 62: replace "diffused (regions" with --(diffused regions--.

Column 4, line 28: replace "element" with --element 10--.

Column 4, line 48: delete the text "dielectric".

Column 5, line 10: replace "56 tunneling, and capacitor" with -- 56, and tunneling capacitor--.

Column 7, line 15: replace "layer" with --second layer--.

Signed and Sealed this

Second Day of September, 1997

Attest:

BRUCE LEHMAN

*Attesting Officer*  *Commissioner of Patents and Trademarks*